United States Patent
Jee

(10) Patent No.: US 9,705,019 B2
(45) Date of Patent: Jul. 11, 2017

(54) SOLAR CELL MODULE AND METHOD OF FABRICATING THE SAME

(71) Applicant: LG INNOTEK CO., LTD., Seoul (KR)

(72) Inventor: Suk Jae Jee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/363,997

(22) PCT Filed: Nov. 30, 2012

(86) PCT No.: PCT/KR2012/010287
§ 371 (c)(1),
(2) Date: Jun. 9, 2014

(87) PCT Pub. No.: WO2013/085228
PCT Pub. Date: Jun. 13, 2013

(65) Prior Publication Data
US 2014/0366941 A1     Dec. 18, 2014

(30) Foreign Application Priority Data
Dec. 9, 2011   (KR) .................. 10-2011-0132370

(51) Int. Cl.
*H01L 31/05*   (2014.01)
*H01L 31/18*   (2006.01)
(Continued)

(52) U.S. Cl.
CPC ...... *H01L 31/0463* (2014.12); *H01L 31/0465* (2014.12); *H01L 31/05* (2013.01);
(Continued)

(58) Field of Classification Search
CPC ....... H01L 31/05; H01L 31/18; H01L 31/042; H01L 31/0216; H01L 31/046;
(Continued)

(56) References Cited

U.S. PATENT DOCUMENTS 4,729,970 A * 3/1988 Nath ................ H01L 21/28
136/258
5,798,284 A * 8/1998 Nakagawa ........... H01L 31/206
136/244
(Continued)

FOREIGN PATENT DOCUMENTS

KR   10-2011-0001793 A   1/2011
KR   10-2011-0060162 A   6/2011

OTHER PUBLICATIONS

C.M. Muiva, Effect of doping concentration on the properties of aluminium doped zinc oxide thin films prepared by spray pyrolysis for transparent electrode applications, Oct. 28, 2010, ScienceDirect, Ceramics International 37 (2011) 555-560.*
(Continued)

*Primary Examiner* — Allison Bourke
*Assistant Examiner* — Michael Y Sun
(74) *Attorney, Agent, or Firm* — Saliwanchik, Lloyd & Eisenschenk

(57) ABSTRACT

Disclosed are a solar cell module and a method of fabricating the same. The solar cell module includes a back electrode layer disposed on a support substrate and having a first separation pattern, a light absorbing layer disposed on the back electrode layer and having a second separation pattern, and a plurality of solar cells disposed on the light absorbing layer and formed with a front electrode layer including an insulator.

4 Claims, 2 Drawing Sheets

(51) Int. Cl.
*H01L 31/0463* (2014.01)
*H01L 31/0749* (2012.01)
*H01L 31/0465* (2014.01)

(52) U.S. Cl.
CPC .......... *H01L 31/0749* (2013.01); *H01L 31/18* (2013.01); *Y02E 10/541* (2013.01)

(58) Field of Classification Search
CPC ............. H01L 21/28; H01L 31/022466; H01L 31/208; H01L 31/0463; H01L 31/0749; H01L 31/0392; H01L 31/03925; H01L 21/3043; H01L 31/206; H01L 31/0465; Y02E 10/541; Y02E 10/50; B23K 26/40; B23K 26/02; B23K 2203/172; Y02P 70/521; Y10S 136/29
USPC .................................................. 136/244, 249
See application file for complete search history.

(56) References Cited

U.S. PATENT DOCUMENTS

| 2011/0186110 | A1* | 8/2011 | Springer | ............... | B23K 26/02 |
| | | | | | 136/249 |
| 2011/0308616 | A1* | 12/2011 | Kamada | .............. | H01L 31/0322 |
| | | | | | 136/262 |
| 2011/0318863 | A1* | 12/2011 | Tu | ..................... | H01L 31/03923 |
| | | | | | 438/68 |
| 2012/0111388 | A1* | 5/2012 | Sung | ................... | H01L 31/0392 |
| | | | | | 136/244 |
| 2012/0132930 | A1* | 5/2012 | Young | ................ | H01L 31/0481 |
| | | | | | 257/84 |

OTHER PUBLICATIONS

C.M. Muiva, "Effect of doping concentration on the properties of aluminium doped zinc oxide thin films prepared by spray pyrolysis for transparent electrode applications" Ceramic International 37 2011 555-560.*
International Search Report in International Application No. PCT/KR2012/010287, filed Nov. 30, 2012.

\* cited by examiner

SOLAR CELL MODULE AND METHOD OF FABRICATING THE SAME

CROSS-REFERENCE TO RELATED APPLICATIONS

This application is the U.S. national stage application of International Patent Application No. PCT/KR2012/010287, filed Nov. 30, 2012, which claims priority to Korean Application No. 10-2011-0132370, filed Dec. 9, 2011, the disclosures of each of which are incorporated herein by reference in their entirety.

TECHNICAL FIELD

The embodiment relates to a solar cell module and a method of fabricating the same.

BACKGROUND

Solar cells may be defined as devices for converting light energy into electric energy by using a photovoltaic effect of generating electrons when light is incident onto a P-N junction diode. The solar cell may be classified into a silicon solar cell, a compound semiconductor solar cell mainly including a group I-III-VI compound or a group III-V compound, a dye-sensitized solar cell, and an organic solar cell according to materials constituting the junction diode.

A solar cell made from CIGS (CuInGaSe), which is one of group I-III-VI Chal-copyrite-based compound semiconductors, represents superior light absorption, higher photoelectric conversion efficiency with a thin thickness, and superior electro-optic stability, so the CIGS solar cell is spotlighted as a substitute for a conventional silicon solar cell.

Referring to FIG. 1, a general CIGS thin film solar cell is fabricated by sequentially forming a substrate 10 including sodium (Na), a back electrode layer 20, a light absorbing layer 30, a buffer layer 40, a high-resistance buffer layer 50, and a front electrode layer 60. Different from a bulk solar cell, the CIGS thin film solar cell is defined by a plurality of solar cell units connect to each other in series or parallel through patterning processes P1 to P3. Inactive regions G1 and G2 are inevitably generated during the patterning processes P1 to P3, thereby lowering the light output of the solar cell module.

Among them, the P3 patterning process is performed to separate a plurality of solar cells C1, C2, and C3. According to the related art, the layers are mechanically removed using a scribing tip (needle). However, such a scheme has a difficulty in controlling a line-width due to the layer tearing so that accurate pattering is difficult. In addition, a suction device or washing device for separating residual materials generated during processing is necessary.

DISCLOSURE OF INVENTION

Technical Problem

The embodiment provides a solar cell module including a plurality of solar cells separated from each other by an accurate laser scheme, and a method of fabricating the same.

Solution to Problem

According to the embodiment, there is provided solar cell module including: a back electrode layer disposed on a support substrate and having a first separation pattern; a light absorbing layer disposed on the back electrode layer and having a second separation pattern; and a plurality of solar cells disposed on the light absorbing layer and formed with a front electrode layer including an insulator.

According to the embodiment, there is provided method of fabricating a solar cell module, the method including: forming a back electrode layer having a first separation pattern on a substrate; forming a light absorbing layer having a second separation pattern on the back electrode layer; and forming a front electrode layer having an insulator on the light absorbing layer.

Advantageous Effects of Invention

According to the solar cell module of the embodiment, a part of the front electrode layer is converted into an insulator by irradiating laser to a predetermined region of the front electrode layer. The solar cells constituting the solar cell module can be separated from each other by the converted insulator.

That is, instead of separating the solar cells from each other by a mechanical scheme according to the related art, the method of fabricating the solar cell module according to the embodiment separates the solar cells from each other by a laser irradiating scheme. Accordingly, in the method of fabricating the solar cell module according to the embodiment, a line-width can be accurately controlled. In addition, since by-products are not generated, additional washing equipment is not required.

MODE FOR THE INVENTION

Figure 1:
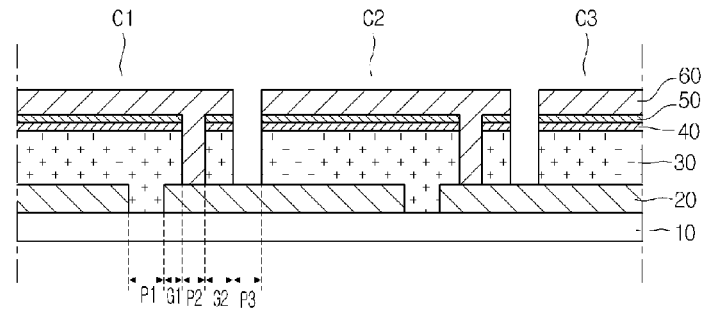
FIG. 1 is a sectional view showing a section of a solar cell module according to the related art.

In the description of the embodiments, it will be understood that when a substrate, a layer, a film or an electrode is referred to as being "on" or "under" another substrate, another layer, another film or another electrode, it can be "directly" or "indirectly" on the other substrate, the other layer, the other film, or the other electrode, or one or more intervening layers may also be present. Such a position of the layer has been described with reference to the drawings. The size of the elements shown in the drawings may be exaggerated for the purpose of explanation and may not utterly reflect the actual size.

FIGS. 2 to 6 are sectional views showing a method of fabricating a solar cell module according to the embodiment. Hereinafter, the solar cell module and a method of fabricating the same according to the embodiment will be described with reference to FIGS. 2 to 6.

Figure 2:
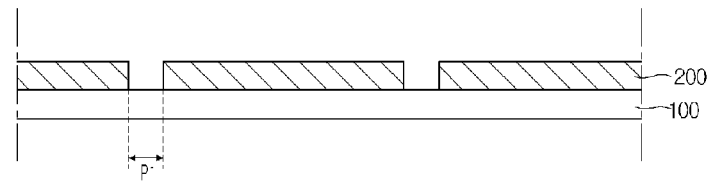
FIGS. 2 to 6 are sectional views showing a method of fabricating a solar cell module according to the embodiment.
Figure 3:
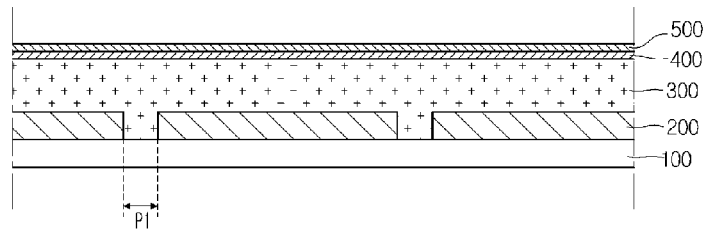

Referring to FIG. 2, a back electrode layer 200 is formed on a support substrate 100. The back electrode layer 200 may be formed through a Physical Vapor Deposition (PVD) scheme or a plating scheme.

The support substrate 100 has a plate shape and supports the back electrode layer 200, a light absorbing layer 300, a buffer layer 400, a high-resistance layer 500, a front electrode layer 600, and an insulator 700.

The support substrate 100 may include an insulator. For example, the support substrate 100 may include a glass substrate, a plastic substrate, or a metallic substrate. In more detail, the support substrate 100 may include a soda lime glass substrate. The support substrate 100 may be transparent. The support substrate 100 may be rigid or flexible.

The back electrode layer 200 is a conductive layer. The back electrode layer 200 may include one selected from the group consisting of molybdenum (Mo), gold (Au), aluminum (Al), chrome (Cr), tungsten (W), and copper (Cu). The back electrode layer 200 may include the Mo. The Mo has a thermal expansion coefficient similar to that of the support substrate 100, so the Mo may improve the adhesive property and prevent the back electrode layer 200 from being delaminated from the substrate 100, and totally satisfying the characteristic required for the back electrode layer 200.

The back electrode layer 200 includes a first separation pattern P1. The first separation pattern P1 is an open region exposing a top surface of the support substrate 100. The first separation pattern P1 may be formed by laser, but the embodiment is not limited thereto.

The back electrode layer 200 may be separated into a plurality of back electrodes by the first separation pattern P1. The first separation pattern P1 may have a width in the range of about 50 μm to about 100 μm, but the embodiment is not limited thereto.

Figure 4:
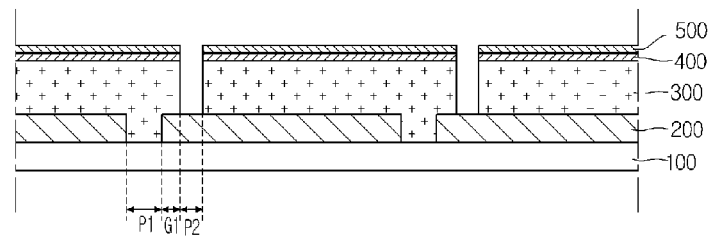

Referring to FIG. 4, the light absorbing layer 300, the buffer layer 400, and the high-resistance buffer layer 500 are sequentially formed on the back electrode layer 200.

The light absorbing layer 300 is provided on the back electrode layer 200. The light absorbing layer 300 includes a group I-III-VI compound. For example, the light absorbing layer 300 may have the CIGSS (Cu(IN,Ga)(Se,S)2) crystal structure, the CISS (Cu(IN)(Se,S)2) crystal structure or the CGSS (Cu(Ga)(Se,S)2) crystal structure. The energy bandgap of the light absorbing layer 300 may be in the range of about 1.0 eV to about 1.8 eV.

The light absorbing layer 300 may be formed through a sputtering scheme or evaporation scheme. The light absorbing layer 300 may be formed through various schemes such as a scheme of forming a Cu(In,Ga)Se2 (CIGS) based light absorbing layer 500 by simultaneously or separately evaporating Cu, In, Ga, and Se and a scheme of performing a selenization process after a metallic precursor layer has been formed.

Regarding the details of the selenization process after the formation of the metallic precursor layer, the metallic precursor layer is formed on the back electrode layer 200 through a sputtering process employing a Cu target, an In target, or a Ga target. Thereafter, the metallic precursor layer is subject to the selenization process so that the Cu (In, Ga) Se2 (CIGS) based light absorbing layer 300 is formed.

In addition, the sputtering process employing the Cu target, the In target, and the Ga target and the selenization process may be simultaneously performed.

Further, a CIS or a CIG based light absorbing layer 300 may be formed through the sputtering process employing only Cu and In targets or only Cu and Ga targets and the selenization process.

The buffer layer 400 is provided on the light absorbing layer 300. According to the solar cell, the CIGS compound, a P-N junction is formed between the light absorbing player 300 of a CIGS or CIGSS compound thin film, which serves as a P-type semiconductor, and the front electrode layer 600 which is an N-type semiconductor. However, since two materials represent the great difference in the lattice constant and the band-gap energy therebetween, a buffer layer having the intermediate band-gap between the band-gaps of the two materials is required to form the superior junction between the two materials.

For example, the buffer layer 400 may include zinc sulfide (ZnS). The buffer layer 400 may a thickness in the range of about 10 nm to about 30 nm, but the embodiment is not limited thereto.

The buffer layer 400 may be formed through atomic layer deposition (ALD) scheme, Metal-Organic Chemical Vapor Deposition (MOCVD) scheme, or a Chemical Bath Deposition (CBD) scheme. In detail, the buffer layer 400 may be formed by the CBD scheme.

The high-resistance buffer layer 500 is disposed on the buffer layer 400. The high-resistance buffer layer 500 may include i-ZnO which is zinc oxide not doped with impurities. The high-resistance buffer layer 500 may be formed by depositing zinc oxide on the buffer layer 400 through a sputtering process.

Referring to FIG. 4, the second separation pattern P2 is formed through the light absorbing layer 300. The second separation pattern P2 may be formed through a mechanical scheme, for example, by mechanically scribing the light absorbing layer 300 using a scribing tip.

In detail, the second separation pattern P2 passes through the high-resistance buffer layer 500, the buffer layer 400, and the light absorbing layer 300. The second separation pattern P2 is formed adjacent to the first through groove P1. That is, when viewed in a plan view, a portion of the second separation pattern P2 is formed beside the first separation pattern P1. The second separation pattern P2 may have a width in the range of about 40 μm to about 150 μm, but the embodiment is not limited thereto.

Figure 5:
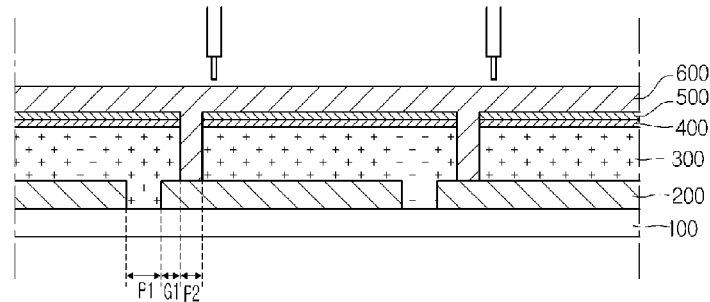

Referring to FIG. 5, the front electrode layer 600 is formed on the high-resistance buffer layer 500. The front electrode layer 600 may be prepared by laminating transparent conductive materials on the high-resistance buffer layer 500. For example, the transparent conductive materials may include zinc oxide, indium tin oxide (ITO), or indium zinc oxide (IZO). In detail, the front electrode layer 600 may be prepared by Al doped zinc oxide (AZO).

In more detail, the front electrode layer 600 may be prepared through a sputtering scheme or a chemical vapor deposition (CVD) scheme. In more detail, the front electrode layer 600 may be formed through the RF sputtering scheme using a ZnO target and the reactive sputtering scheme using a Zn target.

Figure 6:
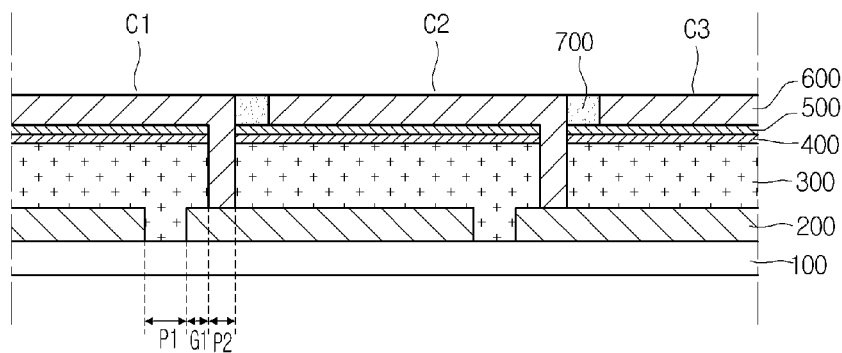

Referring to FIGS. 5 and 6, the insulator 70 is formed at a predetermined region of the front electrode layer 600. The solar cell module according to the embodiment may be divided into a plurality of solar cells C1, C2, and C3 by the insulator 700.

The insulator 700 may be formed by irradiating laser beam to the predetermined region of the front electrode layer 600. The AZO (Al doped zinc oxide) mainly used for the front electrode layer 600 has a characteristic of losing conductivity at a high temperature of about 250° C. or above. The method of fabricating the solar cell module according to the embodiment converts a portion of the front electrode layer 600 to the insulator 700 by irradiating laser beam to a partial region of the front electrode layer 600 based on the above characteristic.

In the method of fabricating the solar cell module according to the embodiment, a line-width is accurately controlled so that accurate patterning can be achieved. The method of fabricating the solar cell module according to the embodiment does not divide solar cells through a mechanical scheme according to the related art. Accordingly, by-products generated through the mechanical scheme are not formed so that additional suction equipment or washing equip becomes unnecessary.

The laser beam used for the laser irradiating scheme may have a wavelength in the range of about 250 nm to 400 nm. When the wavelength of the laser beam is less than about 250 nm, an insulation characteristic of the insulator 700 may not be sufficiently represented. When the wavelength of the laser beam exceeds 400 nm, the laser beam may be transmitted through the front electrode layer 60. To erase the conductivity of the front electrode layer 600, laser beam having a spot size in the range of about 20 μm about 60 μm, and power density in the range of 0.5 J/cm2 to 5 J/cm2 may be used, but the embodiment is not limited thereto.

The insulator 700 prepared by the foregoing scheme is formed of the same material as that of the front electrode layer 600. Both of the front electrode layer 600 and the insulator 700 may be formed of zinc oxide doped with aluminum (ZnO:Al).

A doping concentration of aluminum in the insulator 700 may be different from a doping concentration of aluminum in the front electrode layer 600. In detail, the doping concentration of aluminum in the insulator 700 may be less than the doping concentration of aluminum in the front electrode layer 600. For instance, the insulator 700 is doped with a few amount of aluminum or is not doped with aluminum. Accordingly, the insulator 70 loses the inherent conductivity of the front electrode layer 600.

The insulator 70 may be disposed adjacent to the second separation pattern P2. That is, when viewed in a plan view, the insulator 700 may be formed beside the second separation pattern P2. The insulator 700 may have a width in the range of about 10 μm to about 200 μm, but the embodiment is not limited thereto.

As one example embodiment, one side of the second separation pattern P2 may be aligned on the same extension line with the other side of the insulator 700. That is, the second separation pattern P2 and the insulator 700 may not form a region G2 as illustrated in FIG. 1. This is because the method of fabricating a solar cell according to the embodiment may minutely control a line-width by adjusting a spot side of laser beam. Accordingly, the inactive region (dead zone) may be reduced in a fabricated solar cell module so that optical output of the solar cell module may be increased.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell module comprising:
a back electrode layer disposed on a support substrate and having a first separation pattern;
a light absorbing layer, a buffer layer, and a high resistance buffer layer disposed on the back electrode layer and having a second separation pattern; and
a front electrode layer disposed on the high resistance buffer layer and including an insulator,
wherein the insulator is formed by irradiating with a laser a predetermined region of the front electrode layer,
wherein each of the insulator and the front electrode layer is formed of zinc oxide doped with aluminum (ZnO:Al),
wherein the front electrode layer has a characteristic such that it loses conductivity at a temperature of about 250° C. or above,
wherein the insulator is disposed adjacent to the second separation pattern,
wherein a portion of the front electrode layer is disposed in the second separation pattern and is the same material as the remainder of the front electrode layer,
wherein a side of the portion of the front electrode layer disposed in the second separation pattern is in direct physical contact with the insulator,
wherein the second separation pattern passes through the high resistance buffer layer, the buffer layer, and the light absorbing layer,
wherein the light absorbing layer comprises CIGS (CuInGaSe),
wherein the insulator is disposed on the high resistance buffer layer,
wherein a doping concentration of aluminum in the insulator is less than a doping concentration of aluminum in the front electrode layer,
wherein a line-width of the insulator is adjusted by a spot size of the laser,
wherein the line-width is in a range of from 20 μm to 60 μm,
wherein the insulator is provided as a plurality of insulators,
wherein a plurality of solar cells is defined by the plurality of insulators,
wherein the plurality of insulators are formed at the same time, and
wherein each of the plurality of insulators has the same line-width.

2. The solar cell module of claim 1, wherein one side of the second separation pattern is aligned on a same extension line with a side of the insulator.

3. The solar cell module of claim 1, wherein the first separation pattern has a width in a range of from 50 μm to 100 μm.

4. The solar cell module of claim 1, wherein the second separation pattern has a width in a range of from 40 μm to 150 μm.

* * * * *